(12) United States Patent
Yao

(10) Patent No.: US 8,354,324 B2
(45) Date of Patent: Jan. 15, 2013

(54) MESA HETEROJUNCTION PHOTOTRANSISTOR AND METHOD FOR MAKING SAME

(75) Inventor: Jie Yao, Princeton, NJ (US)

(73) Assignee: Wavefront Holdings, LLC, Basking Ridge, NJ (US)

( * ) Notice: Subject to any disclaimer, the term of this patent is extended or adjusted under 35 U.S.C. 154(b) by 0 days.

(21) Appl. No.: 13/553,420

(22) Filed: Jul. 19, 2012

(65) Prior Publication Data

US 2012/0282720 A1  Nov. 8, 2012

Related U.S. Application Data

(62) Division of application No. 12/687,257, filed on Jan. 14, 2010, now Pat. No. 8,253,215.

(60) Provisional application No. 61/144,906, filed on Jan. 15, 2009.

(51) Int. Cl.
*H01L 21/331* (2006.01)

(52) U.S. Cl. ............ 438/312; 438/94; 438/98; 257/187; 257/E21.211

(58) Field of Classification Search .................... 438/94, 438/98, 312; 257/187, E21.38
See application file for complete search history.

(56) References Cited

U.S. PATENT DOCUMENTS

| | | | |
|---|---|---|---|
| 4,740,687 A | 4/1988 | Kiyohara | |
| 5,229,623 A | 7/1993 | Tanoue et al. | |
| 5,283,447 A | 2/1994 | Olbright et al. | |
| 5,552,837 A | 9/1996 | Mankovitz | |
| 5,851,849 A | 12/1998 | Comizzoli et al. | |
| 5,892,575 A | 4/1999 | Marino | |
| 6,515,740 B2 | 2/2003 | Bamji et al. | |
| 6,544,906 B2 | 4/2003 | Rotondaro et al. | |
| 6,580,496 B2 | 6/2003 | Bamji et al. | |
| 6,640,956 B1 | 11/2003 | Zwieg et al. | |
| 6,770,536 B2 | 8/2004 | Wilk et al. | |
| 6,858,509 B2 | 2/2005 | Delage et al. | |
| 7,045,847 B2 | 5/2006 | Lin et al. | |
| 7,067,853 B1 | 6/2006 | Yao | |
| 7,160,577 B2 | 1/2007 | Ahn et al. | |
| 7,180,103 B2 | 2/2007 | Bude et al. | |

(Continued)

FOREIGN PATENT DOCUMENTS

WO  02/49339  6/2002

OTHER PUBLICATIONS

Sarah Adee, "Transistors Go Vertical", IEEE Spectrum, pp. 14-16, Nov. 2007.

(Continued)

*Primary Examiner* — Eugene Lee
*Assistant Examiner* — Elias M Ullah
(74) *Attorney, Agent, or Firm* — Pillsbury Winthrop Shaw Pittman LLP

(57) ABSTRACT

A two-terminal mesa phototransistor and a method for making it are disclosed. The photo transistor has a mesa structure having a substantially planar semiconductor surface. In the mesa structure is a first semiconductor region of a first doping type, and a second semiconductor region of a second doping type opposite to that of the first semiconductor region, forming a first semiconductor junction with the first region. In addition, a third semiconductor region of the first doping type forms a second semiconductor junction with the second region. The structure also includes a dielectric layer. The second semiconductor region, first semiconductor junction, and second semiconductor junction each has an intersection with the substantially planar semiconductor surface. The dielectric covers, and is in physical contact with, all of the intersections.

10 Claims, 11 Drawing Sheets

U.S. PATENT DOCUMENTS

| | | |
|---|---|---|
| 7,192,892 B2 | 3/2007 | Ahn et al. |
| 7,262,402 B2 | 8/2007 | Niclass et al. |
| 7,563,670 B2 | 7/2009 | Cheng et al. |
| 2003/0087486 A1 | 5/2003 | Laurin et al. |
| 2008/0111175 A1 | 5/2008 | Cheng et al. |
| 2009/0020841 A1 | 1/2009 | Hu et al. |
| 2009/0101919 A1 | 4/2009 | Yao |

OTHER PUBLICATIONS

Biber et al., "Avalanche Photodiode Image Sensor in Standard BiCMOS Technology", IEEE Transactions on Electron Devices, vol. 47, No. 11, pp. 2241-2243, Nov. 2000.

Bohr et al., "The High-K Solution", IEEE Spectrum, pp. 30-35, Oct. 2007.

C. Y. Chen, A. Y. Cho, P. A. Garbinski, C. G. Bethea, and B. F. Levine, "Modulated barrier photodiode: A new majority-carrier photodetector", Applied Physics Letters, 39(4), 340 342, 1981.

Huang et al., "Surface passivation of III-V compount semiconductors using atomic-layer-deposition-grown Al2O3", Applied Physics Letters, 87, pp. 252104-1-252104-3, 2005.

T.I.Kamins, K.Nauka, J.B.Kruger, J.L.Hoyt, C.A.King, D.B.Noble, C.M.Gronet, J.F.Gibbons, "Small-geometry, high-performance, Si—Si(1-x)Ge(x) heterojunction bipolar transistors", IEEE Electron Device Letters, vol. 10, No. 11, pp. 503-505, Nov 1989.

Kim et al., "Novel P-Encapsultated InP JFETs with Very Low Leakage for Optoelectronic Integration with Infrared Focal Plane Arrays", Advanced Technology Center for Photonics and Optoelectronic Materials, pp. 275-276.

Kim et al., "A Monolithically Integrated InGaAs—InP p-i-n / JFET Focal Plane Array", IEEE Photonics Technology Letters, vol. 8, No. 4, pp. 566-568, Apr. 1996.

Kim et al., "Two-Dimensional Active Pixel InGaAs Focal Plane Arrays", Jet Propulsion Laboratory, MS 303-210, California Institute of Technology, Pasadena, California, pp. 1-7.

Clifford A. King, Judy L. Hoyt, James F. Gibbons, "Bandgap and transport properties of Si(1-x)Ge(x) by analysis of nearly ideal Si/Si(1-x)Ge(x)/Si heterojunction bipolar transistors", IEEE Transactions on Electron Devices, vol. 36, pp. 2093-2104, Oct. 1989.

M. J. Lange, D. S. Kim, S. R. Forrest, W. F. Kosonocky, N. A. Doudoumopoulos, M J. Cohen, G. H. Olsen, "Monolithic integration of InGaAs/InP JFET/Detectors for NIR Imaging Applications", SPIE, vol. 2745, p. 55, 1996.

Marshall et al., "Avalanche Photodiode-Based Active Pixel Imager", IEEE Transactions on Electron Devices, vol. 51, No. 3, pp. 509-511, Mar. 2004.

Nilsson et al., "DFB Laser with Nonuniform Couopling Coefficient Realized by Double-Layer Buried Grating", IEEE Photonics Technology Letters, vol. 5, No. 10, pp. 1128-1131, Oct. 1993.

Olson et al., "Near-Infrared Imaging Applications with InGaAs", Sensors Unlimted, Inc., 1995 IEEE Workshop on CCDs and Advanced Imagers (Apr. 20-22, 1995), Dana Point, CA, 1 page.

Erwin Josef Prinz, "Base transport and vertical profile engineering in Si/SiGe/Si heterojunction bipolar transistors", Ph.D. dissertation, Princeton University, 1992.

Rochas et al., "Low-Noise Silicon Avalanche Photodiodes Fabricated in Conventional CMOS Technologies", IEEE Transactions on Electron Devices, vol. 49, No. 3, Mar. 2002.

Sarathy et al., "Monolithic Active Pixel InGaAs Focal Plane Arrays for Near Infrared Imaging", Proc. SPIE vol. 2999, pp. 225-234, Photodetectors: Materials and Devices II, Gail J. Brown; Manijeh Razeghi; Eds.

H. Shao, W. Li, A. Torfi, D. Moscicka, W. I. Wang, Room-Temperature p-n-p. AlGaAsSb—InGaAsSb Heterojunction Phototransistors With Cutoff Wavelength at 2.5 um, IEEE Photonics Technology Letters, vol. 18, No. 22, pp. 2326-2328, Nov. 15, 2006.

Ye, Peide, "Beyond Silicon's Elemental Logic in the Quest for Speed, Key Parts of Micro-Processors May Soon Be Made of Gallium Arsenide or Other III-V Semiconductors", IEEE SPectrum, pp. 39-43, Sep. 2008.

Yu et al., "A Monolithically Integrated 1×4 Switchable Photodiode Array with Preamplifier for Programmable Frequency Filters and Optical Interconnects", IEEE Photonics Technology Letters, vol. 9, No. 5, pp. 675-677, May 1997.

US 8,354,324 B2

MESA HETEROJUNCTION PHOTOTRANSISTOR AND METHOD FOR MAKING SAME

RELATED APPLICATIONS

This application is a divisional of U.S. patent application Ser. No. 12/687,257, filed Jan. 14, 2010, which in turn claims priority under 35 U.S.C. §119 to U.S. Provisional Application No. 61/144,906, entitled MESA HETEROJUNCTION PHOTOTRANSISTOR AND METHOD FOR MAKING SAME, filed Jan. 15, 2009, the entire content of each of which is hereby incorporated by reference.

FIELD

This application is related to optoelectronic devices.

BACKGROUND

With its high sensitivity, low amplification noise, high speed and high gain stability and uniformity from device to device, the phototransistor is a promising candidate for low light level sensing applications. One such device structure is disclosed in U.S. Pat. No. 7,067,853 entitled "Image Intensifier Using High-Sensitivity High-Resolution Photodetector Array".

In a mesa semiconductor device structure the mesa surfaces, including top surface and sidewall surfaces, are often passivated with a passivation material to increase device performance and reliability. A number of different dielectric materials have been tried as passivation materials. These passivation materials have been fabricated using a wide range of deposition techniques and thin film growth techniques. Only the specific combination of high dielectric constant (high-k) dielectric material deposited using atomic layer deposition (ALD), as disclosed in U.S. patent application Ser. No. 12/244,938, has had some success in the passivation of heterojunction phototransistor (HPT) mesa sidewalls. This technique, however, now requires extensive fabrication process development and may be relatively costly to manufacture. A passivation method utilizing existing fabrication facilities, equipment, and processes in the semiconductor photodetector industry may be desirable.

SUMMARY

A two-terminal mesa phototransistor and a method for making it are disclosed. The photo transistor has a mesa structure having at least one substantially planar semiconductor surface. In the mesa structure is a first semiconductor region of a first doping type, and a second semiconductor region of a second doping type opposite to that of the first semiconductor region. The second semiconductor region forms a first semiconductor junction with the first region. In addition, a third semiconductor region of the first doping type forms a second semiconductor junction with the second region. The structure also includes a dielectric layer. The second semiconductor region, first semiconductor junction, and second semiconductor junction each has an intersection with at most one substantially planar semiconductor surface. The dielectric covers, and is in physical contact with, all of the intersections.

DETAILED DESCRIPTION

This application refers to U.S. patent application Ser. No. 12/244,938, published as U.S. Patent Application Publication No. 2009/0101919, entitled "PHOTO-DETECTOR ARRAY, SEMICONDUCTOR IMAGE INTENSIFIER AND METHODS OF MAKING AND USING THE SAME", the entire disclosure of which is hereby incorporated by reference as if fully set forth herein. This application also refers to U.S. Pat. No. 7,067,853 entitled "Image Intensifier Using High-Sensitivity High-Resolution Photodetector Array", the entire disclosure of which is hereby incorporated by reference as if fully set forth herein.

Taught in this disclosure is a mesa heterojunction phototransistor (HPT) in which all p-n and p-i-n junctions terminate at one essentially planar semiconductor mesa surface. In comparison to existing mesa HPTs, where p-n or p-i-n junctions terminate at more than one plane, termination of all junctions at one single plane, as disclosed herein, may provide optimal and convenient surface passivation, low dark current as well as lower development and manufacturing costs, despite perhaps resulting in fewer device design options, reduced photo detection speed, and larger pixel sizes.

Figure 1:
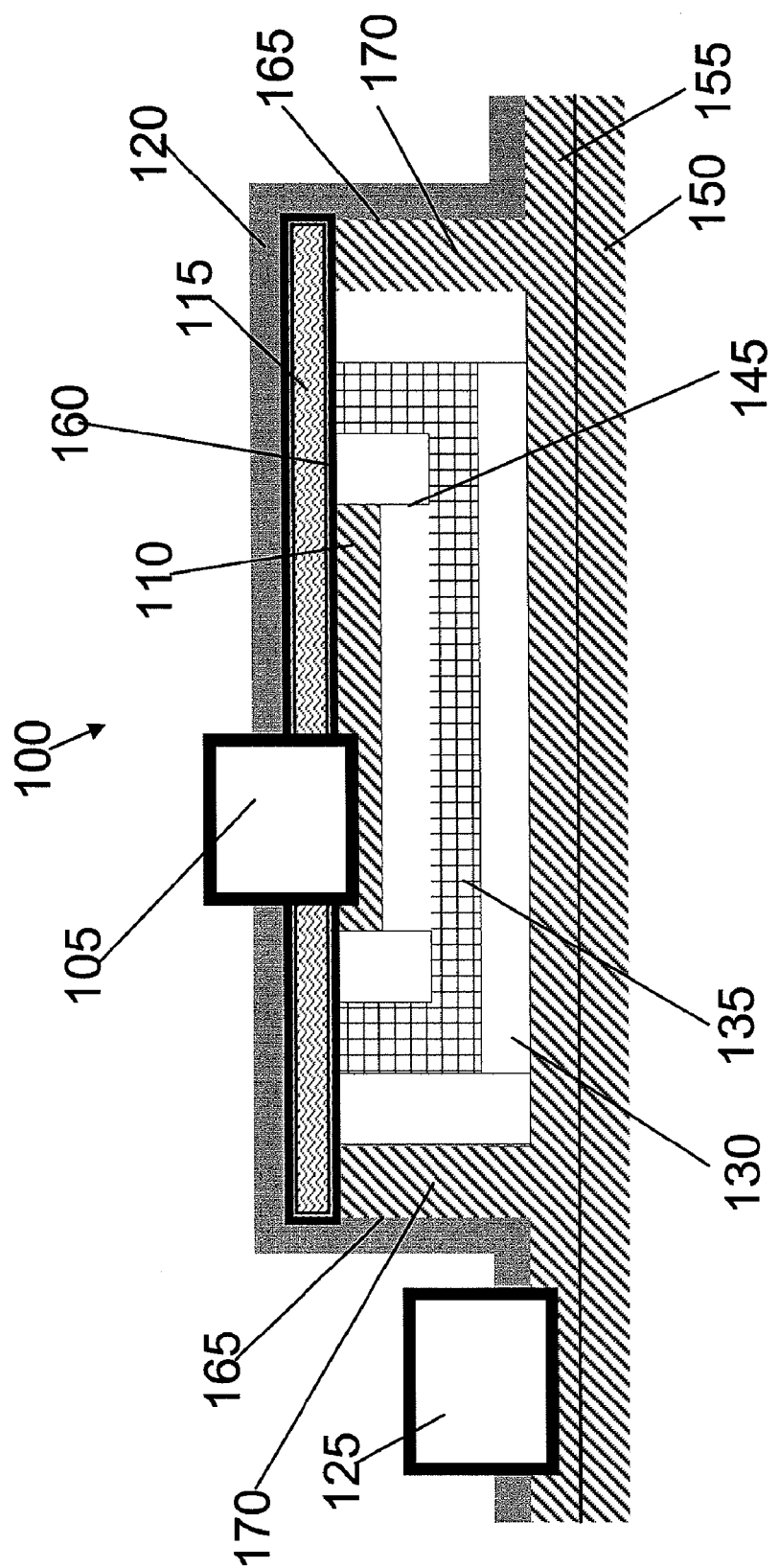
FIG. 1 shows a vertical cross section of an embodiment of a mesa phototransistor.
Figure 2:
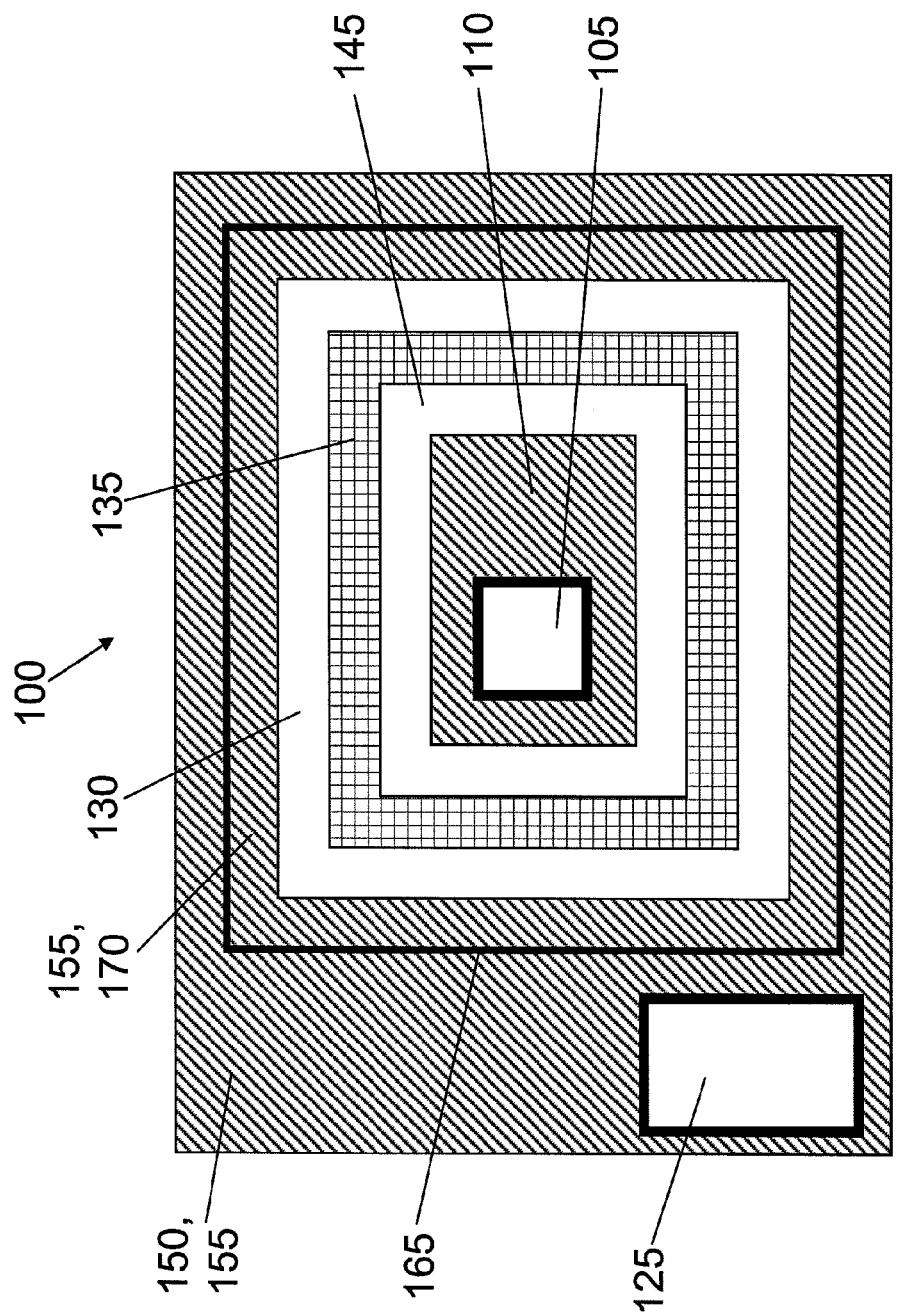
FIG. 2 shows a top view of a first embodiment of a mesa phototransistor.

FIGS. 1 and 2 shows a vertical cross-section and a top view, respectively, of an embodiment of a mesa HPT 100, which is presented as an example and not intended to be limiting. HPT 100 may be fabricated using semiconductor materials such as gallium arsenide (GaAs), indium phosphide (InP), indium gallium arsenide (InGaAs), gallium nitride (GaN), or silicon-germanium (SiGe) in various combinations. Each of these materials may be doped to be either p-type or n-type.

The structure of HPT 100 is distinct from previously disclosed devices in many ways. HPT 100 is a two-terminal floating-base mesa phototransistor. Its base is floating, without any connection to an external electrical contact. It utilizes the vertical transport of minority carriers. It is used for optical detection and amplification of photocurrents, especially at low light levels.

HPT 100 is distinct from existing device structures, including the metal-oxide-semiconductor field-effect transistor (MOSFET); the high electron mobility transistor (HEMT); and the junction field effect transistor (JFET) including those JFETs with a structure published by Lange et al. (M. J. Lange, D. S. Kim, S. R. Forrest, W. F. Kosonocky, N. A. Doudoumopoulos, M J. Cohen, G. H. Olsen, "Monolithic integration of InGaAs/InP JFET/Detectors for NIR Imaging", SPIE, vol. 2745, p. 55, 1996).

HPT 100 is distinct from a bipolar transistor (BJT).

HPT 100 is distinct from a heterojunction bipolar transistor (HBT), including HBT structures published by Kamins et al. (T. I. Kamins, K. Nauka, J. B. Kruger, J. L. Hoyt, C. A. King, D. B. Noble, C. M. Gronet, J. F. Gibbons, "Small-geometry, high-performance, Si—Si$_{(1-x)}$Ge$_{(x)}$ heterojunction bipolar transistors", IEEE Electron Device Letters, vol. 10, No. 11, pp. 503-505, November 1989); by King et al. (Clifford A. King, Judy L. Hoyt, James F. Gibbons, "Bandgap and transport properties of Si(1-x)Ge(x) by analysis of nearly ideal Si/Si(1-x)Ge(x)/Si heterojunction bipolar transistors", IEEE Transactions on Electron Devices, vol. 36, pp. 2093-2104, October 1989); and by Prinz (Erwin Josef Prinz, "Base transport and vertical profile engineering in Si/SiGe/Si heterojunction bipolar transistors", Ph.D. dissertation, Princeton University, 1992).

HPT 100 is distinct from a p-i-n photodiode (PIN), an avalanche photodiode (APD) and previous HPTs disclosed by C. Y. Chen et al. (C. Y. Chen, A. Y. Cho, P. A. Garbinski, C. G. Bethea, and B. F. Levine, "Modulated barrier photodiode: A new majority-carrier photodetector", Applied Physics Letters, 39(4), 340 342, 1981) and by Shao et al. (H. Shao, W. Li, A. Torfi, D. Moscicka, W. I. Wang, Room-Temperature p-n-p AlGaAsSb—InGaAsSb Heterojunction Phototransistors With Cutoff Wavelength at 2.5 um, IEEE Photonics Technology Letters, Vol. 18, No. 22, pp. 2326-2328 (Nov. 15, 2006)).

The MOSFET, HEMT and JFET are all field-effect transistors (FETs). A FET typically has 4 terminals—source, gate, drain and the substrate tie. A FET is a majority carrier device, in which charged majority carriers are transported horizontally, that is, along the substrate. Vertical FETs, in which charged majority carriers are transported perpendicular to the substrate, are under investigation. FETs are purely electrical devices with no optical functionality. FETs cannot directly amplify electrical photo current, as an HPT can, because of the high-impedance gate terminal.

The JFET disclosed by Lange et al. consists of one single n-channel with source and drain terminals surrounded by one single continuous p-type region at the bottom, a sidewall, and a gate terminal. This JFET is not a bipolar transistor, because it has only one p-doped and continuously connected gate, a sidewall, and a bottom region. It is not a 2-terminal phototransistor with floating base, because the source and drain terminals contact and expose the re-channel at the semiconductor mesa top surface. Furthermore, this JFET is a majority carrier device with horizontal carrier transport. Reported as a current switch to be integrated with a photodetector, it also has no optical or current amplification functionality, due to the high input impedance at its gate electrode.

The BJT and HBT are bipolar transistors, that is, 3-terminal electrical devices relying on vertical minority carrier transport. Part of the base has to be exposed for electrical contact, as distinct from HPT 100.

The HBTs of Kamins et al, King et al, and Prinz have p-n junctions intersecting both the mesa top surface and the surrounding sidewall even in the L1=0 version by Kamins. As will be described below, such a structure is contrary to that of HPT 100, an embodiment shown in FIG. 1.

The PIN and the APD are 2-terminal photodiodes with vertical carrier transport. However, the PIN does not have intrinsic photocurrent amplification, as does the HPT disclosed here. An APD and a bipolar transistor do provide intrinsic photocurrent amplification, but the amplification mechanisms are different in the two devices. The APD amplifies by an impact ionization avalanche mechanism leading to non-uniformity and excess noise, whereas a bipolar transistor amplifies using charge control without avalanche, in a manner well known to a person of ordinary skill in the art.

Concentrating only on device epitaxial structures, current literature on HPTs (C. Y. Chen 1981; W. I. Wang 2006) discuss devices that have their emitter junction, base, and collector junction all intersect the sidewall surface surrounding the HPT mesa, and therefore these reported HPTs may lack sufficient passivation for reliable performance.

HPT 100, an embodiment shown in FIG. 1, and alternatives will now be described in detail. In what follows, "doping type" refers to the net doping type resulting from intentional doping, either n or p, of a semiconductor, without regard to specific dopant concentrations. A semiconductor layer with n-type doping is broadly understood to contain either a single semiconductor layer or a plurality of constituent semiconductor sublayers, and no layer or sublayer is intentionally doped p-type. Furthermore it is to be understood that at least one layer or sublayer is intentionally doped n-type. Remaining sublayers, if they exist, are not intentionally doped and are referred to as i-type.

Similarly, a semiconductor layer with p-type doping is broadly understood to contain either a single semiconductor layer or a plurality of constituent semiconductor sublayers, and no layer or sublayer is intentionally doped n-type. Furthermore it is to be understood that at least one layer or sublayer is intentionally doped p-type. Remaining sublayers, if they exist, are not intentionally doped and are referred to as i-type.

Both p- and n-doping types refer to the net doping type after dopant compensation.

FIG. 1 shows a mesa HPT 100 built on a semiconductor substrate 150. The mesa has a top semiconductor surface 160 and a sidewall surface 165. Top surface 160 may be substantially planar. A first semiconductor region 155 is situated on the substrate 150. First semiconductor region 155 is of a first doping type. A second semiconductor region 135 is of a second doping type which is opposite to that of first semiconductor region 155. First 155 and second 135 semiconductor regions, being oppositely doped, form a p-n or p-i-n junction 130. Junction 130 is shown in FIG. 1 as having a width, rather than as simply a line—that is, the junction is represented by the white region 130. In addition to providing clarity to the drawing, the width of junction 130 may be considered to represent the depletion region which spreads out from any p-n or p-i-n junction, as is known to a person of ordinary skill in the art. In descriptions and drawings which follow, p-n or p-i-n junctions are similarly described and drawn.

A third semiconductor region 110 may be of the first doping type, opposite to that of second semiconductor region 135. Third semiconductor region 110 may therefore form a second semiconductor junction 145 with second semiconductor region 135.

First semiconductor region 155 includes a portion 170 which extends inward from sidewall surface 165 and surrounds mesa HPT 100. As a result, first semiconductor junction 130 likewise surrounds mesa HPT 100. Because of surrounding first semiconductor region 155 and first semiconductor junction 130, second semiconductor region 135, first semiconductor junction 130, and second semiconductor junction 145 each has an intersection with a semiconductor mesa surface only at top surface 160, and not with sidewall surface 165. A first dielectric layer 115, covering top surface 160, also covers, and is in physical contact with, all of these intersections. Thus, first semiconductor region 155, including portion 170; third semiconductor region 110; and first dielectric layer 115 completely encapsulate first semiconductor junction 130, second semiconductor region 135, and second semiconductor junction 145. These regions and junctions are thus protected from the environment external to mesa HPT 100. First dielectric layer 115 may be a passivation layer, acting to passivate top surface 160.

A second dielectric layer 120 covers first dielectric layer 115 and sidewall surface 165. Alternatively, first dielectric layer 115 may also extend down, and cover and passivate mesa sidewall 165. Second dielectric layer 120 may be a second passivation layer, acting to passivate sidewall surface 165, to protect first dielectric layer 115, or both.

A first contact 105 makes electrical contact with third semiconductor region 110, providing a means for electrically connecting mesa HPT 100 to an external circuit. First contact 105 may include a metal extending through an opening in first dielectric layer 115 and forming an ohmic contact with third semiconductor region 110, in a manner known to a person of ordinary skill in the art. Similarly, a second contact 125 makes electrical contact with first semiconductor region 155.

FIG. 2 shows a top view of mesa HPT 100. The same guide numbers used in FIG. 1 are used in FIG. 2 to indicate corresponding features. First dielectric layer 115 and second dielectric layer 120 are not included in FIG. 2 for greater clarity.

Figure 3:
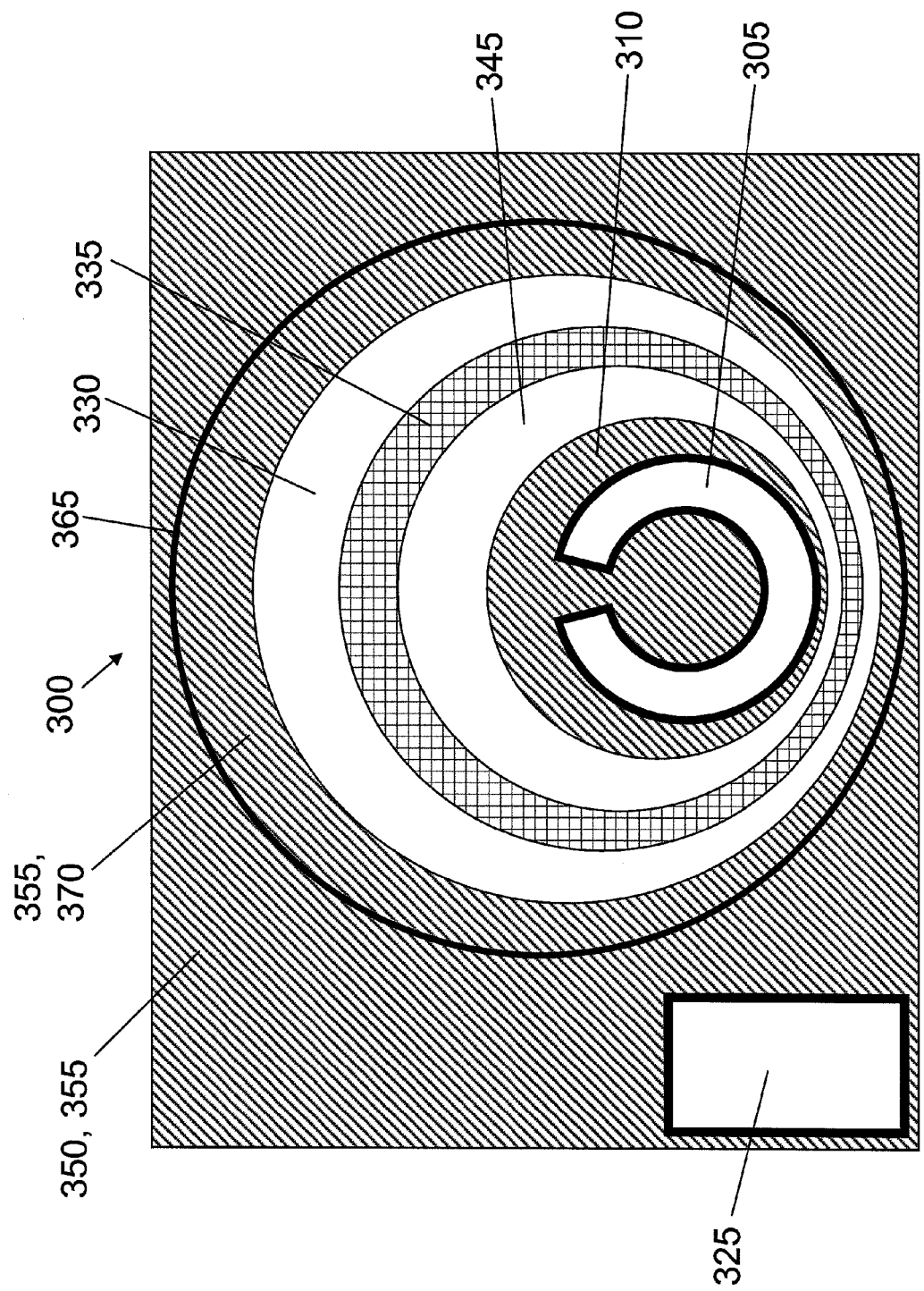
FIG. 3 shows a top view of a second embodiment of a mesa phototransistor.

FIG. 3 shows a top view of another embodiment of a mesa HPT 300. In this embodiment the mesa itself has an essentially cylindrical shape, as distinct from the essentially rectangular shape of mesa HPT 100 of FIGS. 1 and 2. In fact, arbitrary mesa shapes are possible. All features of mesa HPT 100 shown in FIGS. 1 and 2 have corresponding features in mesa HPT 300. The correspondence is indicated by corresponding guide numbers. Thus, in FIG. 3, a first semiconductor region 355 corresponds to first semiconductor region 155; first semiconductor junction 330 corresponds to first semiconductor junction 130; and so forth. In the embodiment of FIG. 3, as in the embodiment of FIGS. 1 and 2, first semiconductor junction 330, second semiconductor region 335, and second semiconductor junction 345 each has an intersection with a semiconductor surface only at the mesa top surface, and not with sidewall surface 365. Furthermore, in the embodiment of FIG. 3, a first dielectric layer (not shown) covers, and is in physical contact with, all of these intersections. Thus, first semiconductor region 355, including portion 370, third semiconductor region 310, and the first dielectric layer (not shown) completely encapsulate first semiconductor junction 330, second semiconductor region 335, and second semiconductor junction 345.

In a specific example of the embodiments of FIGS. 1 and 2 and FIG. 3, not intended to be limiting, mesa HPT 100 or 300 may be configured as a p-n-p phototransistor. In this example, substrate 150 may be semi-insulating or p-type InP. First semiconductor region 155 may be p-type InGaAs and p-type InP. Second semiconductor region 135 may be n-type InGaAs. Third semiconductor region 110 may be p-type InP. In this embodiment, first semiconductor junction 130 is a homojunction. Second semiconductor junction 145 is a heterojunction, since it is formed with different materials on each side. A structure with two or no heterojunction is also possible.

In another specific example of the embodiments of FIGS. 1 and 2 and FIG. 3, not intended to be limiting, mesa HPT 100 or 300 may be configured as an n-p-n phototransistor. In this example, substrate 150 may be semi-insulating or n-type Si. First semiconductor region 155 may n-type Si. Second semiconductor region 135 may be p-type SiGe. Third semiconductor region 110 may be n-type Si. In this embodiment, both first semiconductor junction 130 and second semiconductor junction 145 are heterojunctions, formed with different materials on each side.

Other suitable materials for HPT 100 or 300 include GaAs, AlGaAs, InGaAs, InGaP, InAlAs, InP, GaN, AlGaN, InGaN, Si, SiGe, SiGeC, and their alloys, as known to a person of ordinary skill in the art.

First dielectric layer 115 and second dielectric layer 120 may contain at least one of a grown oxide; a deposited oxide; a native oxide; a silicon nitride, such as $SiN_x$; a high k dielectric; or other appropriate materials known to a person of ordinary skill in the art. Examples of high-k dielectrics include aluminum oxide ($Al_2O_3$), titanium dioxide ($TiO_2$), tantalum pentoxide ($Ta_2O_5$), hafnium dioxide ($HfO_2$), hafnium silicate ($HfSiO_4$), hafnium silicon oxynitride, zirconium oxide ($ZrO_2$), zirconium silicate ($ZrSiO_4$), and lanthanum oxide ($La_2O_3$).

Continuing with the specific example of the embodiment of FIGS. 1 and 2 and FIG. 3, first semiconductor region 155, including portion 170, may be a collector of mesa HPT 100, second semiconductor region 135 may be a base of mesa HPT 100, and third semiconductor region 110 may be an emitter of mesa HPT 100. Second semiconductor region 135 may be a floating base, making mesa HPT a two-terminal device. This may be called a top-emitter device.

Alternatively, first semiconductor region 155, including portion 170, may be an emitter and third semiconductor region 110 may be a collector of mesa HPT 100. Second semiconductor region 135 may remain a floating base, making mesa HPT a two-terminal device. In this case, called a bottom-emitter device, the relative polarity of first semiconductor region 155, including portion 170, and third semiconductor region 110 would be opposite to that of the top-emitter device.

Considering the top emitter device, third semiconductor region 110 (emitter) is located at or near the center portion of the top of the HPT mesa. Second semiconductor region 135 (base), collector junction 130, and emitter junction 145 are completely surrounded by semiconductor region 155, including portion 170 (collector) both underneath and at the mesa sidewall, and by semiconductor region 110 (emitter) at the center or near-center of the mesa top, and by first dielectric layer 115 at outer portions of the mesa top. First semiconductor junction 130 (collector junction), second semiconductor region 135 (base) and second semiconductor junction 145 (emitter junction) all intersect a mesa surface only at mesa top surface 160, which is passivated by first dielectric layer 115. Second dielectric layer 120 further protects first dielectric layer 115.

A plurality of devices such as mesa HPT 100 or mesa HPT 300 may be arranged as an image detecting array, such as a focal plane array. Each mesa HPT may act as a single pixel, isolated from neighboring devices by an etched trench surrounding each mesa, as described below. The etched trench surrounding each mesa may or may not penetrate the entire thickness of semiconductor region 155. In such an array, inter-pixel crosstalk may be minimized.

FIGS. 4-11 show an embodiment of a process, described below, for fabricating a mesa HPT such as that shown in FIGS. 1 and 2, or 3. The process described below is not intended to be limiting, as alternatives may occur to a person of ordinary skill in the art which do not, however, lie outside the scope of the accompanying claims. For example, some steps of the process may be performed in an order which is different from that presented below, but the resulting device structure will be unchanged or equivalent to that disclosed here.

Figure 4:
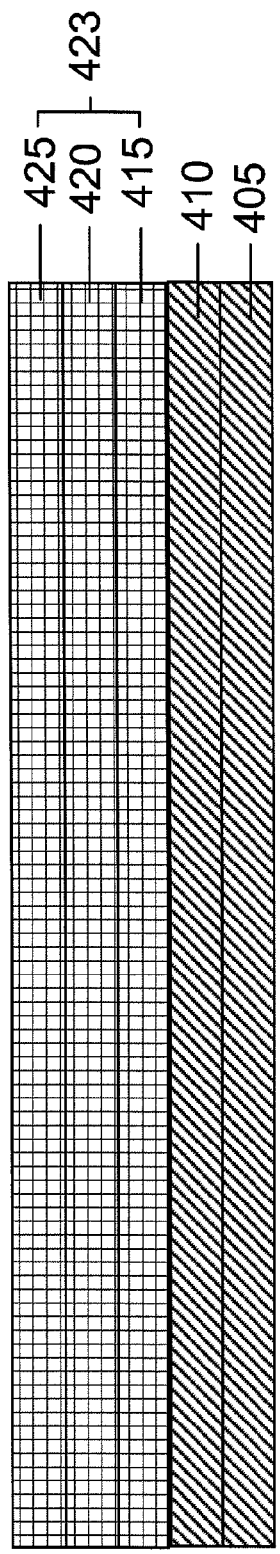
FIGS. 4 through 11 show an embodiment of a fabrication process for a mesa phototransistor.

Referring to FIG. 4, a first semiconductor layer 410 of a first doping type (p or n) is fabricated on a substrate 405. Substrate 405 may be a semiconductor. A second semiconductor layer 423 is fabricated over first semiconductor layer 410. Second semiconductor layer 423 may be made up of a plurality of sublayers 415, 420, and 425. For simplicity, only three layers are shown, but this is not intended to be limiting. At least one of sublayers 415, 420, 425 within second semiconductor layer 423 is intentionally doped as a second doping type which is opposite to the doping type of first semiconductor layer 410. First semiconductor layer 410 and second semiconductor layer 423 may be fabricated using an epitaxial growth process.

Figure 5:
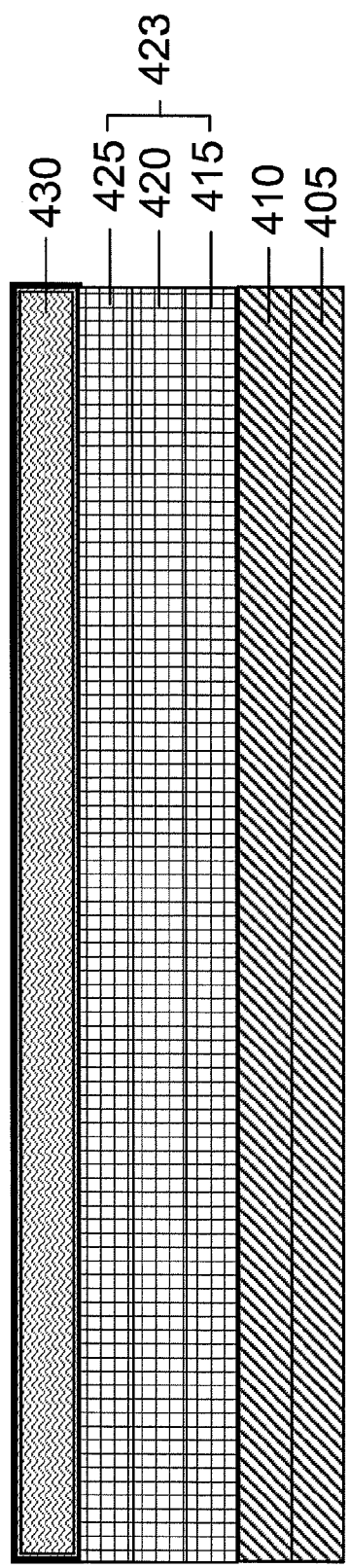

Referring to FIG. 5, a first dielectric layer 430 is fabricated over second semiconductor layer 423. Possible fabrication techniques for first dielectric layer 430 include atomic layer deposition (ALD), plasma-enhanced chemical vapor deposition (PECVD), thermally grown native oxide, and other techniques known to a person of ordinary skill in the art. Suitable materials for first dielectric layer 430 include aluminum oxide $Al_2O_3$ or other high-k dielectrics; nitrides of silicon, such as $SiN_x$; or a silicon oxide, such as $SiO_2$ or other materials known to a person of ordinary skill in the art. First dielectric layer 430 may become part of the final device structure. It may serve as a passivation layer for a top surface of second semiconductor layer 423. Alternatively, it may serve only as a sacrificial masking layer and then be removed, as described below, in which case first dielectric layer 430 may be fabricated again, later in the fabrication process, to provide semiconductor surface passivation.

Figure 6:
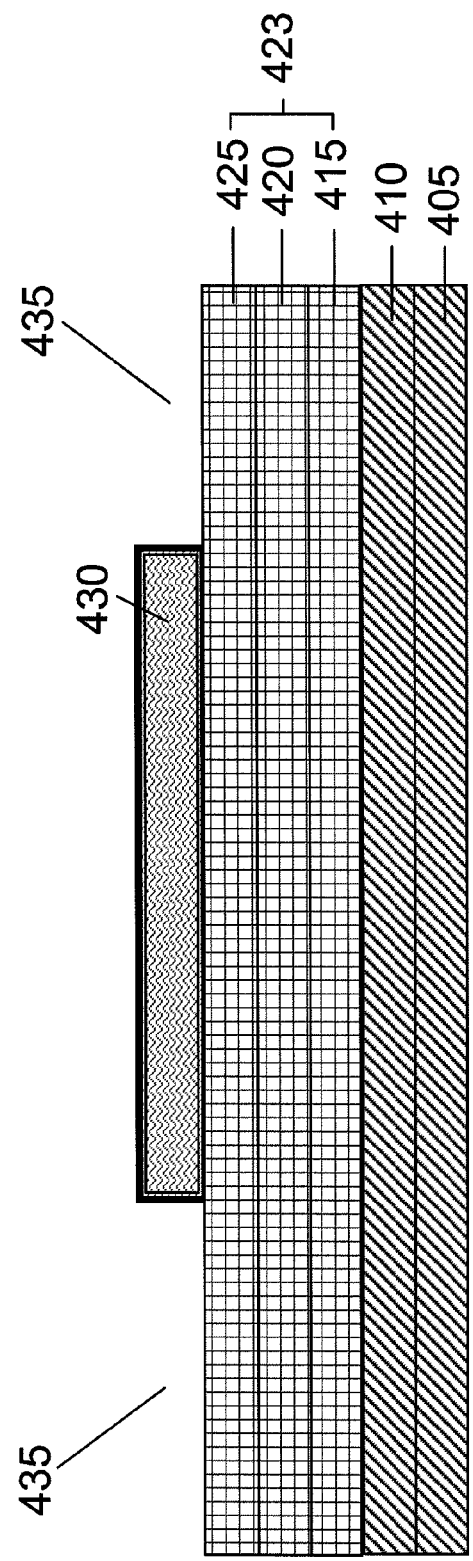

Referring now to FIG. 6, the patterning of a mesa structure begins with patterning of first dielectric layer 430, leaving an isolated portion of first dielectric layer 430 completely surrounded by a beginning of an isolation trench region 435. As described above, an isolation trench region 435 may isolate each mesa structure from similar neighboring mesa structures in an array. The patterning of first dielectric layer 430 may be done with an etch process. The etch process, in turn, may be defined by a process such as photolithography.

Figure 7:
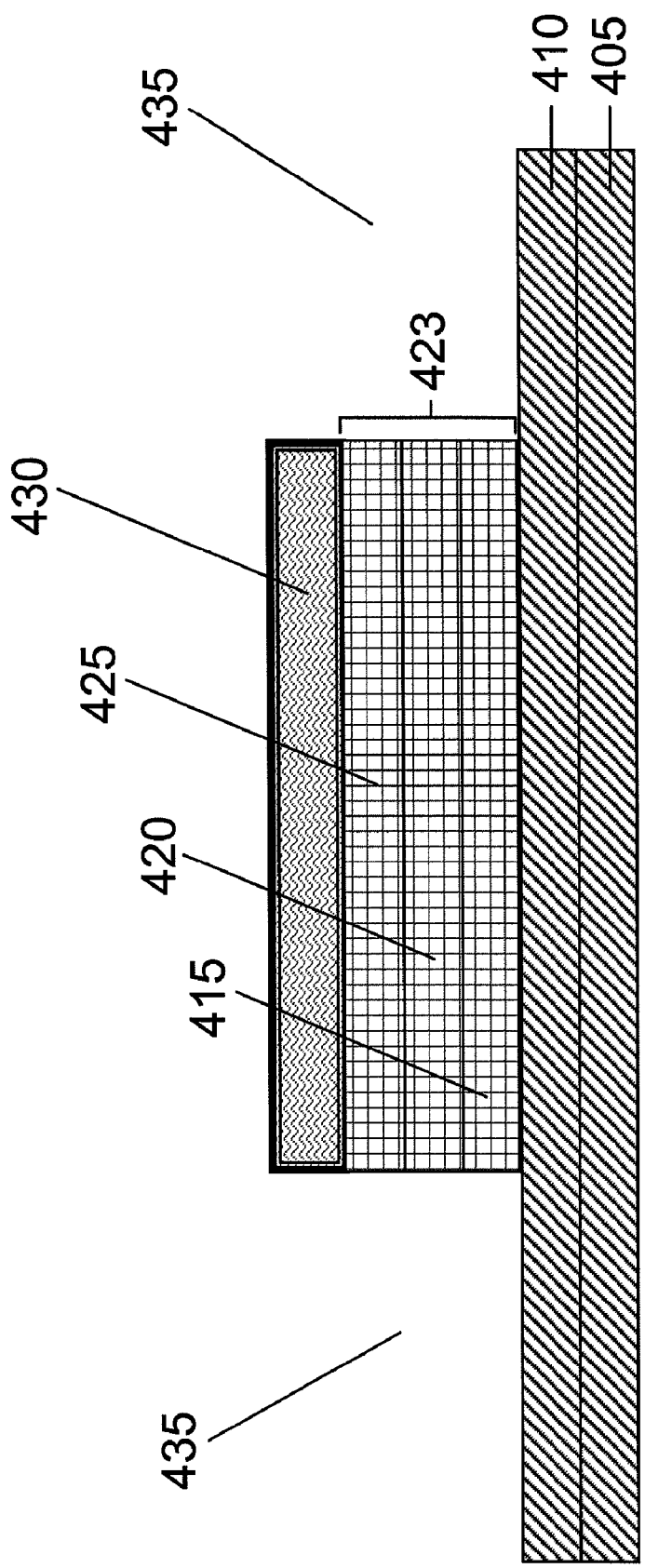

Referring to FIG. 7, a second etch process is performed. The second etch process etches second semiconductor layer 423, stopping at or inside first semiconductor layer 410. A mesa structure surrounded by isolation trench 435 has now been defined. The mesa structure includes an isolated portion of second semiconductor layer 423, as shown in FIG. 7. The mesa structure may include an isolated portion of first semiconductor layer 410, not shown in FIG. 7. The mesa structure may also include portions of sublayers 415, 420, and 425, and first dielectric layer 430, as shown in FIG. 7.

At this point, first dielectric layer 430 may be left in place and included in the final device structure. It may function as a passivation layer in the final device structure. The remaining description of the fabrication process, shown in FIGS. 8-11, forms a description of this embodiment. Alternatively, first dielectric layer 430 may be removed at this point in the fabrication process, having served only as a sacrificial masking layer for the second etch process defining isolation trench 435. In this alternative, first dielectric layer 430 may be fabricated again, later in the process, to passivate the mesa top surface.

The use of a dielectric layer such as first dielectric layer 430 is not necessary to define isolation trench 435. Many other patterning processes may be used, as will be recognized by a person of ordinary skill in the art.

Figure 8:
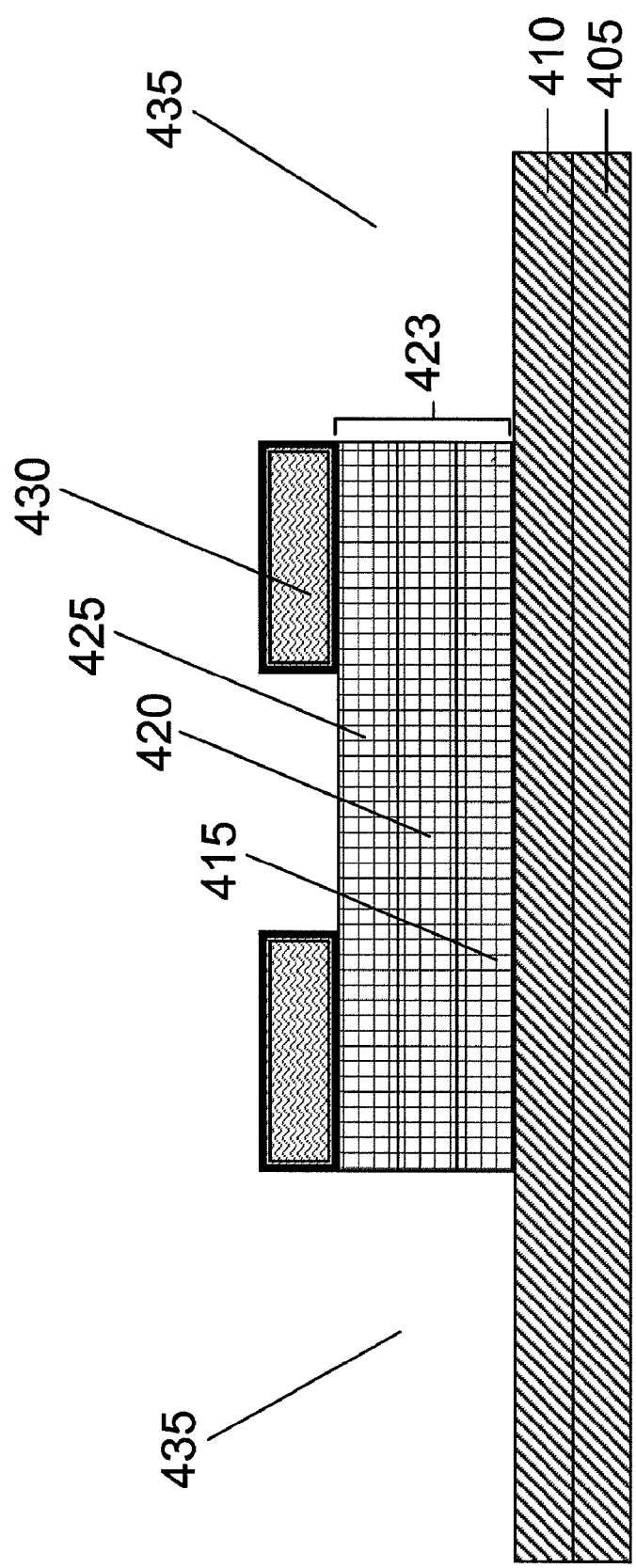

Referring to FIG. 8, an opening is patterned in first dielectric layer 430. Alternatively, if first dielectric layer 430 has been removed, a new masking layer may be fabricated in its place for the processing to follow.

Figure 9:
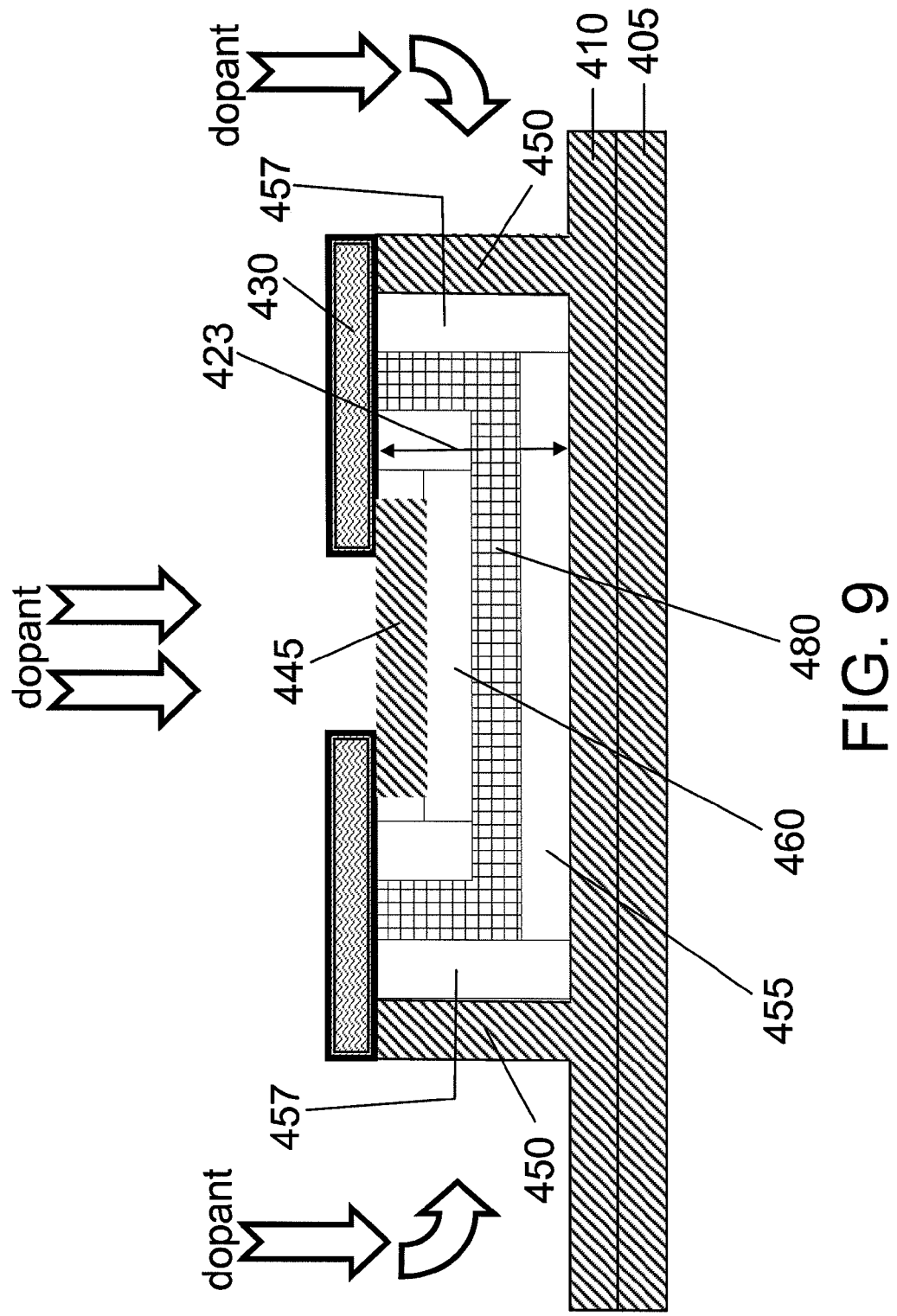
Figure 10:
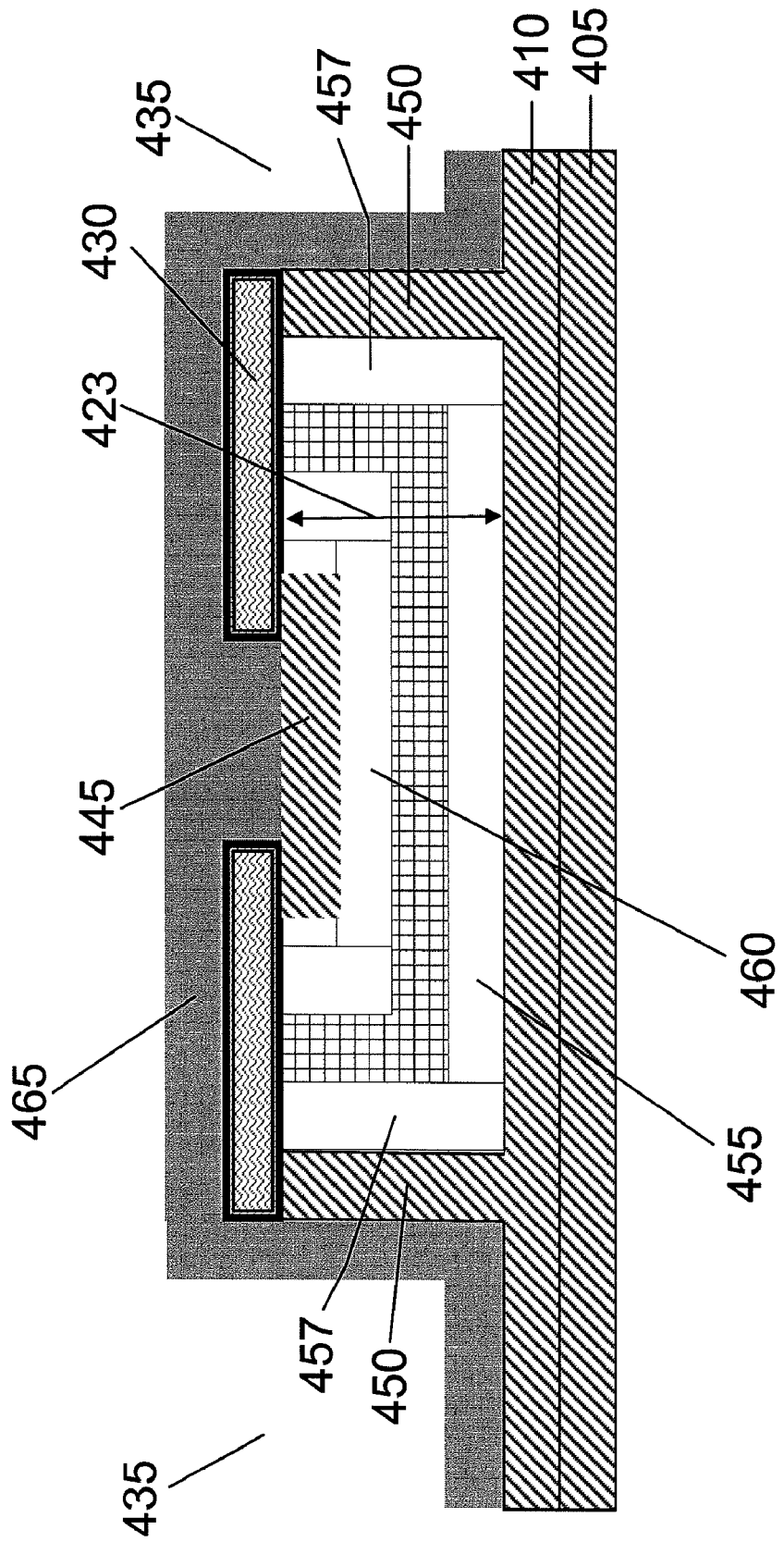
Figure 11:
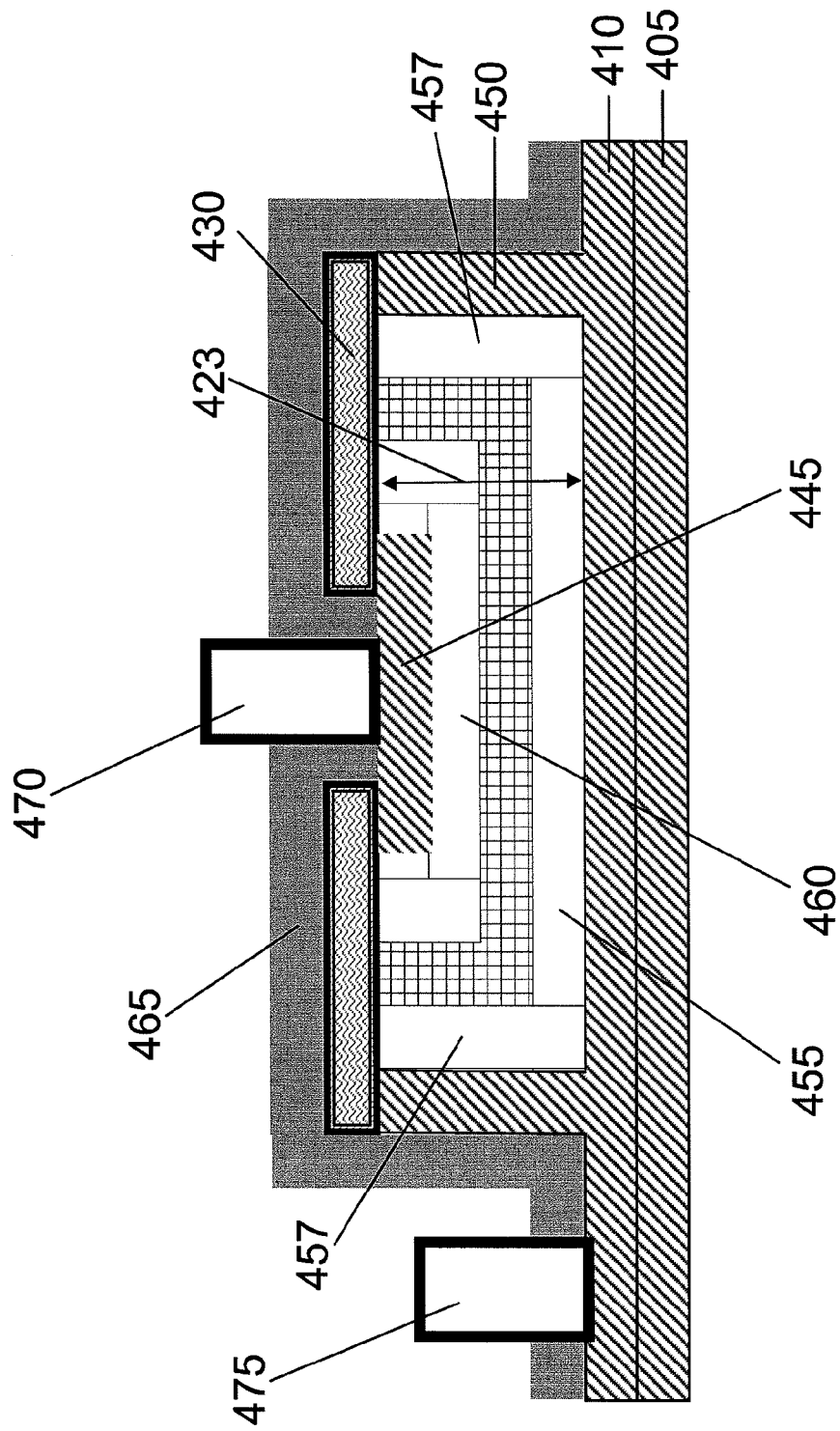

In FIGS. 9-11 optional sublayers 415, 420, and 425 are omitted for clarity, and only the entirety of second semiconductor layer 423 is indicated. First semiconductor junction 455 is shown in FIGS. 9-11. Referring to FIG. 9, dopant of the first type, (that is, the same doping type as that of first semiconductor layer 410) is introduced through the opening in first dielectric layer 430 to form a top doped region 445 of the first type within second semiconductor layer 423. A second semiconductor junction 460 is formed by the opposite doping types of second semiconductor layer 423 and top doped region 445. At the same time, the same dopant of the first type used to form top doped region 445 may be introduced into the mesa sidewall to form mesa sidewall doped region 450 completely surrounding the mesa structure. Mesa sidewall doped region 450 is electrically directly connected to first semiconductor layer 410. Sidewall doping region 450 gives rise to an extension 457 of first semiconductor junction 455. The mesa now contains a region 480 of second semiconductor layer 423 which has the second doping type. Region 480 is sandwiched between first semiconductor junction 455 including the extension of first semiconductor junction 457, and second semiconductor junction 460. First semiconductor junction 455 with extension 457, region 480, and second semiconductor junction 460 do not intersect a mesa sidewall surface but rather intersect a surface of the mesa structure only on a top surface, which lies immediately underneath first dielectric layer 430. First semiconductor junction 455 with extension 457, region 480, and second semiconductor junction 460 are encapsulated by first semiconductor layer 410, sidewall doping region 450, top doped region 445 and first dielectric layer 430.

As an alternative, the doping of top doped region 445 and the doping of sidewall doping region 450 may be separate doping steps.

Doping of top doped region 445 or of sidewall doping region 450 may be done by ion implantation or by diffusion, or a combination of these in any order. Formation of top doped region 445 or sidewall doping region 450 or both may include a thermal treatment to drive the dopant into the mesa structure and to anneal damage, as known to a person of ordinary skill in the art.

An example of a p-type dopant usable for the formation of top doped region 445 and sidewall doping region 450 is zinc (Zn) from a sealed ampoule at 500 degrees Celsius using $Zn_2As_3$ as the source. In this example, second semiconductor layer 423 would start as n-type. The resulting p-type sidewall doping region 450 may be electrically directly connected to a p-doped first semiconductor layer 410.

An alternative to the doping methods described above for the formation of top doped region 445 and sidewall doping region 450 is the thermal diffusion of phosphorus or arsenic dopants from heavily doped poly-crystalline silicon deposited by chemical vapor deposition (CVD).

In one embodiment the net doping density in the mesa sidewall doping region 450 may be at least 3 times as high as the net doping density in region 480 of second semiconductor layer 423, that is, the region 480 of second semiconductor layer 423 which is beyond mesa sidewall doped region 450. The net doping density in region 480 may be less than about $10^{18}$ per cubic centimeter. The depth of mesa sidewall doped region 450 and top doped region 445 (that is, the depth measured inward from a sidewall surface or top surface of the mesa structure, respectively) may be greater than about 100 Angstroms. These depths may be less than about one tenth of a width of the mesa (measured horizontally as depicted in FIGS. 9-11) to prevent internal shorts. Mesa sidewall doped region 450 and top doped region 445 may be doped to a final net doping density greater than about $10^{17}$ per cubic centimeter after dopant compensation.

Referring to FIG. 10, a second dielectric layer 465 is fabricated, completely encapsulating the mesa structure and covering isolation trench 435. Second dielectric layer 465 may protect the HPT along with first dielectric layer 430. Suitable materials and fabrication processes for second dielectric layer 465 include the same ones presented above for first dielectric layer 430.

Referring to FIG. 11, first contact 470 to top doped region 445 and second contact 475 to first semiconductor layer 410, which is connected to sidewall doping region 450, are fabricated. Openings are formed in second dielectric layer 465 (and, if necessary, in first dielectric layer 430). A layer of electrically conducting material, such as a metal, is fabricated over second dielectric layer 465 and patterned, leaving first contact 470 and second contact 475. This completes the description of one embodiment of a fabrication process for a mesa HPT. First contact 470 and second contact 475 may or may not be fabricated in one step.

In an alternative embodiment, in which second semiconductor layer 423 includes sublayers 415, 420, and 425, as described above, first semiconductor junction 455, including its depletion region, may be contained entirely within sublayer 415, and second semiconductor junction 460 may be contained entirely within sublayer 425.

Those of ordinary skill in the art may recognize that many modifications and variations of the above may be implemented without departing from the spirit or scope of the following claims. Thus, it is intended that the following claims cover the modifications and variations provided they come within the scope of the appended claims and their equivalents.

What is claimed is:

1. A method of fabricating a two-terminal mesa phototransistor, comprising:
    fabricating on a substrate a first semiconductor layer of a first doping type;
    fabricating a second semiconductor layer of a second doping type on the first semiconductor layer, the second doping type being opposite to the first doping type, the second semiconductor layer forming portions of a first semiconductor junction with the first semiconductor layer;
    etching the first and the second semiconductor layers to produce a mesa structure comprising mesa sidewalls, residue of the first semiconductor layer, the portions of the first semiconductor junction, and residue of the second semiconductor layer;
    forming a third doped region within the residue of the second semiconductor layer by introducing a first dopant of the first type into the residue of the second semiconductor layer, thereby creating a second semiconductor junction, wherein the third doped region within the residue of the second semiconductor layer and the second semiconductor junction forms one of an emitter or a collector of the phototransistor;
    forming a fourth mesa sidewall doped region by doping a region of the sidewalls with a second dopant of the first type, wherein an electrically active doping level of the fourth mesa sidewall doped region is higher than an electrically active doping level of the second semiconductor layer at the time of formation of the second semiconductor layer, wherein the fourth mesa sidewall doped region is electrically directly connected to the residue of the first semiconductor layer, wherein (i) the fourth mesa sidewall doped region and the residue of the first semiconductor layer and (ii) the residue of the second semiconductor layer form the first semiconductor junction; and
    fabricating a dielectric layer on at least a portion of the residue of the second semiconductor layer;
    wherein the residue of the first semiconductor layer, the fourth mesa sidewall doped region, the third doped region, and the dielectric layer together completely encapsulate the first semiconductor junction, the residue of the second semiconductor layer without the third doped region, and the second semiconductor junction;
    wherein the residue of the first semiconductor layer, the fourth mesa sidewall doped region, the residue of the second semiconductor layer, and the dielectric layer together completely encapsulate the first semiconductor junction;
    wherein the first semiconductor junction, the second semiconductor junction, and the dielectric layer together completely encapsulate the residue of the second semiconductor layer without the third doped region; and
    wherein the residue of the second semiconductor layer without the third doped region, the third doped region, and the dielectric layer together completely encapsulate the second semiconductor junction.

2. The method of claim 1, wherein the forming of the third doped region within the residue of the second semiconductor layer and the forming of the fourth mesa sidewall doped region occur simultaneously.

3. The method of claim 1, wherein the forming of the fourth mesa sidewall doped region comprises doping by at least one of dopant diffusion or ion implantation.

4. The method of claim 1, wherein final doping type of the fourth mesa sidewall doped region is opposite to doping type of the residue of the second semiconductor layer without the third doped region and beyond the fourth mesa sidewall doped region, and net doping density in the fourth mesa sidewall doped region is at least 3 times as high as net doping density in the residue of the second semiconductor layer without the third doped region and beyond the fourth mesa sidewall doped region.

5. The method of claim 1, wherein net doping density in the residue of the second semiconductor layer without the third doped region and beyond the fourth mesa sidewall doped region is less than about $10^{18}$ per cubic centimeter.

6. The method of claim 1, wherein fabricating the second semiconductor layer comprises fabricating at least two sublayers of the second doping type, and wherein the first semiconductor junction and the second semiconductor junction are not both formed with one sublayer.

7. The method of claim 1, wherein forming the fourth mesa sidewall doped region comprises doping the sidewall to a depth greater than about 100 Angstroms.

8. The method of claim 1, wherein forming the fourth mesa sidewall doped region comprises doping the sidewall to a depth less than about one tenth of a width of the mesa.

9. The method of claim 1, wherein forming the fourth mesa sidewall doped region comprises doping the fourth mesa sidewall doped region to a final doping density greater than about $10^{17}$ per cubic centimeter after dopant compensation.

10. The method of claim 1, wherein fabricating the dielectric layer comprises at least one of growing an oxide, depositing using plasma enhanced chemical vapor deposition, or depositing a high-k dielectric using atomic layer deposition.

* * * * *